(12) United States Patent
Bright

(10) Patent No.: US 6,305,076 B1
(45) Date of Patent: Oct. 23, 2001

(54) APPARATUS FOR TRANSFERRING A PLURALITY OF INTEGRATED CIRCUIT DEVICES INTO AND/OR OUT OF A PLURALITY OF SOCKETS

(75) Inventor: Larry N. Bright, Fremont, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/489,256

(22) Filed: Jan. 21, 2000

(51) Int. Cl.⁷ .................................................. H05K 13/04
(52) U.S. Cl. ................. 29/837; 29/741; 29/739; 29/758; 29/740
(58) Field of Search .............................. 29/837, 739, 740, 29/741, 758, 764, 759; 198/431, 434; 361/820, 695

(56) References Cited

U.S. PATENT DOCUMENTS

| | | | |
|---|---|---|---|
| 3,727,284 | * 4/1973 | Ragard et al. | 29/203 |
| 4,304,514 | 12/1981 | Pfaff . | |
| 4,349,945 | * 9/1982 | Fox | 29/27 A |
| 4,370,805 | 2/1983 | Pfaff . | |
| 4,459,743 | * 7/1984 | Watanable et al. | 29/740 |
| 4,567,652 | 2/1986 | Gussman et al. . | |
| 4,573,263 | * 3/1986 | De Rossi | 29/741 |
| 4,817,273 | 4/1989 | Lape et al. . | |
| 4,868,975 | * 9/1989 | Zaremba et al. | 29/741 |
| 5,093,982 | 3/1992 | Gussman et al. . | |
| 5,093,984 | 3/1992 | Lape . | |
| 5,100,332 | * 3/1992 | Egawa | 439/72 |
| 5,208,975 | * 5/1993 | Hidese | 29/832 |
| 5,223,785 | 6/1993 | Becker . | |
| 5,233,752 | * 8/1993 | Lyons | 29/796 |
| 5,273,441 | * 12/1993 | Volz et al. | 439/72 |
| 5,360,348 | * 11/1994 | Johnson | 439/72 |
| 5,369,879 | * 12/1994 | Goeschel et al. | 29/837 |
| 5,397,998 | 3/1995 | Soeno et al. . | |
| 5,446,394 | 8/1995 | Cassidy . | |
| 5,509,193 | 4/1996 | Nuxoll . | |
| 5,535,873 | 7/1996 | Sakamoto et al. . | |
| 5,567,177 | 10/1996 | Foerstel et al. . | |
| 5,926,027 | * 7/1999 | Bumb, Jr. et al. | 324/755 |
| 5,940,303 | 8/1999 | Sakai et al. . | |
| 5,946,546 | 8/1999 | Fillion et al. . | |
| 6,115,909 | * 9/2000 | Miller | 29/741 |

* cited by examiner

Primary Examiner—Lee Young
Assistant Examiner—Minh Trinh
(74) Attorney, Agent, or Firm—Christopher P. Maiorana, P.C.

(57) ABSTRACT

An apparatus for transferring of integrated circuit devices or other devices into and/or out of a plurality of sockets includes at least one guide rod; a presser housing slidingly coupled to the at least one guide rod; a socket presser block movably coupled to the presser housing and a handle assembly. The presser block defines a matrix of cutouts and ribs and is configured to assume a first position in which the presser housing is slideable on the guide rod and a second position in which the matrix of cutouts is aligned with corresponding underlying sockets mounted to a board and in which at least some of the ribs push on the underlying sockets to retract contacts thereof to allow the devices to be transferred into and/or out of the underlying sockets through the cutouts. The handle assembly is mechanically coupled to the presser block and is configured to selectively assume an unlocked position that places the presser block in the first position and a locked position that places the presser block in the second position.

19 Claims, 8 Drawing Sheets

APPARATUS FOR TRANSFERRING A PLURALITY OF INTEGRATED CIRCUIT DEVICES INTO AND/OR OUT OF A PLURALITY OF SOCKETS

BACKGROUND OF THE INVENTION

1. Field of the Invention

The present invention pertains to the field of semiconductor integrated circuits. More specifically, the present invention relates to the transferring of integrated circuit devices into and/or out of a plurality of sockets, as may occur during the burn-in process, for example.

2. Description of the Related Art

Integrated circuit devices often must undergo a burn-in process, whereby the devices are operated under accelerated aging conditions to stabilize their circuitry and to detect premature failures. Such accelerated aging conditions may include an elevated temperature (the devices may be baked in an oven), elevated voltage and/or elevated humidity. To start the burn-in process, the devices to be burned in must be removed from a tray or tube onto or in which the devices were placed after manufacturing and loaded onto a burn in board. The burn in board may include a plurality of sockets, which are receptacles that mechanically hold the devices in place and electrically couple the device to be burned to the testing circuitry. In the case of Zero Insertion Force ("ZIF") sockets, the top portion of the sockets (also called the "lid" of the socket) must be pushed down in order to retract the contacts of the socket. The leads of the device may then drop down into corresponding holes in the socket, whereupon the socket lid may be released, causing the socket contacts to come into contact with and bear down on the device leads, thereby mechanically holding and electrically coupling the device to the socket.

Automated loaders exist to load and unload integrated circuit devices into and out of burn in board. Such devices rely upon a so-called preciser, which compensates for any misalignment between the tray on which the devices rest prior to loading and the burn in board sockets. A suction device on the automatic loader picks up the devices from the tray and places them on the preciser. The devices must then be picked up from the preciser and placed within the sockets of the burn in board. The unloading operation follows the opposite sequence: the devices are picked up from the sockets and placed on the preciser, whereupon they are again picked up and placed back upon the tray for later testing. Each of these motions may be considered to be an insertion and automated loaders carry out the equivalent of four insertions. Each such insertion increases the risk that the leads of the device will be bent, which decreases the yield of the overall process. As automated loaders are complex and costly devices (typically costing on the order of several hundreds of thousands of dollars), their suitability must be carefully evaluated, not only in terms of purchasing and maintenance costs, but also in terms of the attendant risk of damaging the leads of the integrated circuit devices to be burned in.

One alternative to such automated loaders is to carry out the device loading and unloading process manually. However, such loading can become tiring for the worker, who must manipulate small outline packages (such as Thin Small Outline Package "TSOP", for example) and corresponding sockets with their fingers without damaging the leads of the devices to be inserted in the sockets. Indeed, the worker must push down the lid of the ZIF socket to retract the socket contacts while simultaneously aligning the device with and pushing the device into the socket. Understandably, damaged leads are a relatively common occurrence when the devices are transferred into and/or out of sockets in this manner.

What are needed, therefore, are devices and methods for transferring of integrated circuit devices into and/or out of a plurality of sockets that are inexpensive and that ease the strain on the workers' fingers as he or she loads and/or unloads the devices from the sockets. Also needed are devices and methods that increase the speed at which integrated circuit devices may be loaded and/or unloaded from a plurality of sockets.

SUMMARY OF THE INVENTION

An object of the present invention, therefore, is to provide improved devices and methods for loading and/or unloading integrated circuit devices from a plurality of sockets. In particular, the objects of the present invention include providing devices and methods to transfer integrated circuit devices to and from mating sockets that are inexpensive to implement and maintain, that are less damaging to the leads of the devices and that exhibit an increased yield.

In accordance with the above-described objects and those that will be mentioned and will become apparent below, an apparatus for transferring of integrated circuit devices into and/or out of a plurality of sockets, according to an embodiment of the present invention, includes at least one guide rod; a presser housing slidingly coupled to the guide rod; a socket presser block movably coupled to the presser housing, and a handle assembly. The presser block defines a matrix of cutouts and ribs and is configured to assume a first position in which the presser housing is slideable on the guide rod and a second position in which the matrix of cutouts is aligned with corresponding underlying sockets mounted to a board and in which at least some of the ribs push on the underlying sockets to retract contacts thereof to allow the devices to be transferred into and/or out of the underlying sockets through the cutouts. The handle assembly is mechanically coupled to the presser block and is configured to selectively assume an unlocked position that places the presser block in the first position and a locked position that places the presser block in the second position.

According to further embodiments, the apparatus further includes a presser guide post, the presser guide post constraining a motion of the presser block as it transitions between the first and second positions. At least one return spring may be disposed between the presser housing and the presser block, the return spring biasing the presser block away from the presser housing. A guide rod supporting structure may also be provided, the structure defining an indentation therein and wherein the presser housing includes a bearing, the bearing being configured to roll on the base as the presser housing is slid on the guide rod, the bearing perceptively dropping into the indentation when the matrix of cutouts defined in the presser block is aligned with the underlying sockets. Each of the underlying sockets may include a first side and a second side opposite the first side and at least one of the ribs may be configured to simultaneously push on the first side of a first socket and on the second side of a second socket disposed immediately adjacent to the first socket. The handle assembly may include a bearing assembly that bears on the presser block as the handle assembly is transitioned between the unlocked and the locked position. The handle assembly may include independently movable first and second handles pivotally coupled to the presser block, the first and second handles being disposed on respective sides of the presser block that are parallel to the at least one guide rod. The presser housing and the presser block may be dimensioned and oriented such that a length thereof extends at least across a width of the board.

According to another embodiment thereof, the present invention is a method of transferring of integrated circuit devices into and/or out of a plurality of sockets, including steps of disposing a socket presser block across at least some of the plurality of sockets, the presser block defining a matrix of cutouts and ribs and being configured to assume a first position in which the presser block is movable and a second position in which the matrix of cutouts is adapted to align with corresponding underlying sockets mounted to a board and in which at least some of the ribs are adapted to push on the underlying sockets to retract contacts thereof to allow the devices to be transferred into and/or out of the underlying sockets; a first placing step to place the presser block in the first position and moving the presser block so the sockets are aligned with the cutouts, and a second placing step to place the presser block in the second position and manually transferring the devices into and/or out of the sockets underlying the cutouts.

The first and second placing steps may include steps of switching a position of a handle assembly that is mechanically coupled to the presser block, the handle assembly being configured to selectively assume an unlocked position that places the presser block in the first position and a locked position that places the presser block in the second position. The transferring step may include a step of manipulating the devices with a vacuum pen. The presser block may be movably coupled to a presser housing that may be configured to slide against a guide rod and the moving step may include a step of sliding the presser housing until the cutouts are aligned with the underlying sockets. The guide rod may be supported by a guide rod supporting structure, the structure defining an indentation therein. The presser housing may include a bearing that is configured to roll on the base as the presser housing is slid on the guide rod, and wherein the moving step is carried out until an operator perceives the bearing dropping into the indentation, which indicates that the matrix of cutouts defined in the presser block is aligned with the underlying sockets.

The foregoing and other features of the invention are described in detail below and set forth in the appended claims.

BRIEF DESCRIPTION OF THE DRAWINGS

For a further understanding of the objects and advantages of the present invention, reference should be made to the following detailed description, taken in conjunction with the accompanying figures, in which.

DESCRIPTION OF THE PREFERRED EMBODIMENTS

Figure 1:
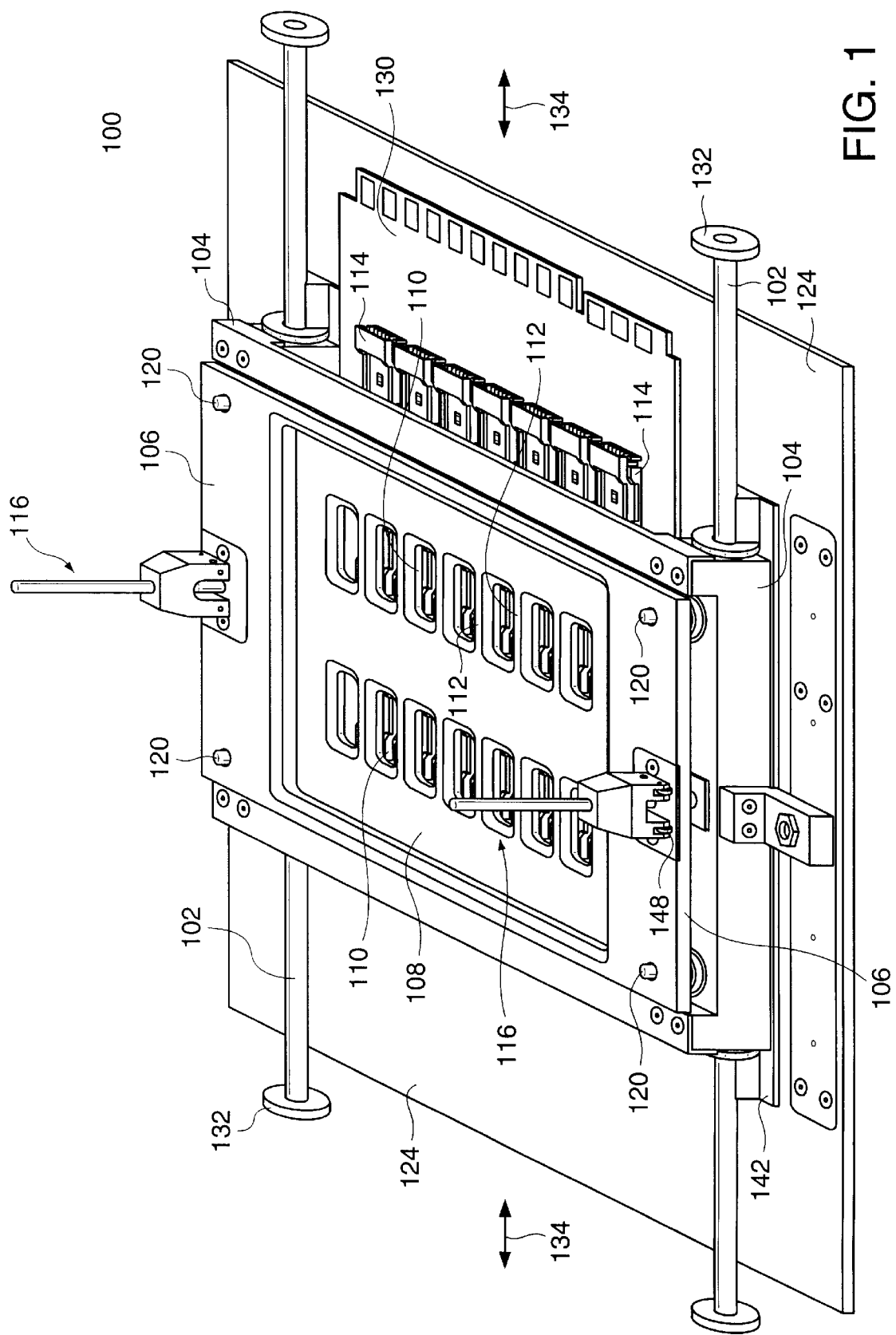
FIG. 1 is a perspective view of the apparatus for transferring a plurality of integrated circuit devices into and/or out of a plurality of sockets, according to an embodiment of the present invention.

FIG. 1 is a perspective view of the apparatus for transferring a plurality of integrated circuit devices into and/or out of a plurality of sockets, according to an embodiment of the present invention. As shown therein, the apparatus (hereafter, "jig") 100 includes at least one guide rod 102. In the embodiment shown in FIG. 1, the jig 100 includes two such guide rods 102, disposed apart from and substantially parallel to one another. A presser housing 104 is slidingly coupled to the guide rod(s) 102 so as to enable the presser housing 104 to slide on the guide rod(s) 102 in the direction indicated by travel arrows 134. The guide rod(s) 102 may be secured to a base 124 or other mounting surface.

A socket presser block 106 is movably coupled to the presser housing 104. The presser block 106 is configured to move relative to the presser housing 104 in a direction that is substantially perpendicular to that direction indicated by the travels arrows 134. The socket presser block 106 includes a top surface 108 in which a matrix of cutouts 110 and ribs 112 is defined. The movable presser block 106 is configured to assume a first position in which the presser housing 104 is slidable on the guide rod(s) 102 and a second position in which the matrix of cutouts 110 is aligned with underlying sockets 114 mounted to a (burn-in, for example) board 130. As shown in FIG. 1, the board 130 may be mounted so as to allow the overlying presser housing 104 to straddle the underling board 130. A plurality of sockets 114 may be mounted on the board 130, the sockets being configured to mechanically secure and electrically couple integrated circuit devices mountable therein. The ribs 112 are preferably defined in the top surface 108 of the presser block 106 such that when the presser block 106 is in the second position, the ribs are brought into contact with and push on the sockets 114 mounted to the board 130 to retract the contacts thereof. Once the contacts of the sockets 114 are retracted, integrated circuit devices (an exemplar of which is shown at 136 in FIG. 3) may be (manually or automatically) transferred into and/or out of the sockets 114 through the cutouts 110.

Figure 2:
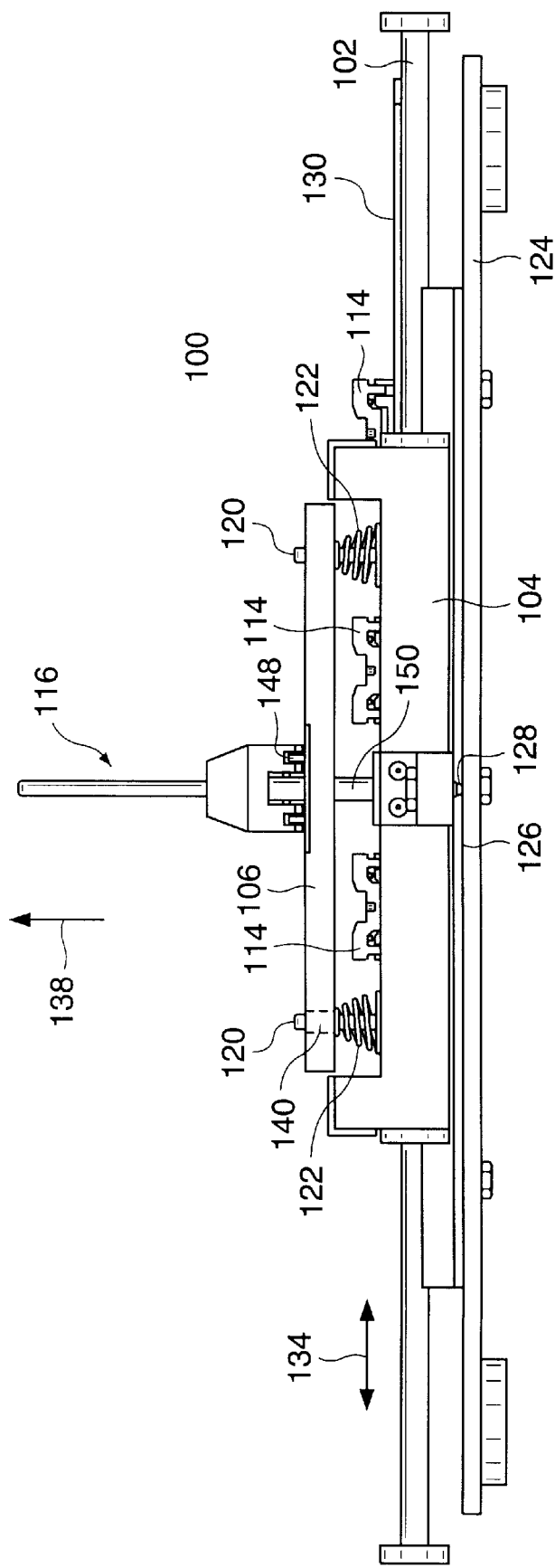
FIG. 2 is a side view of the device of FIG. 1.
Figure 3:
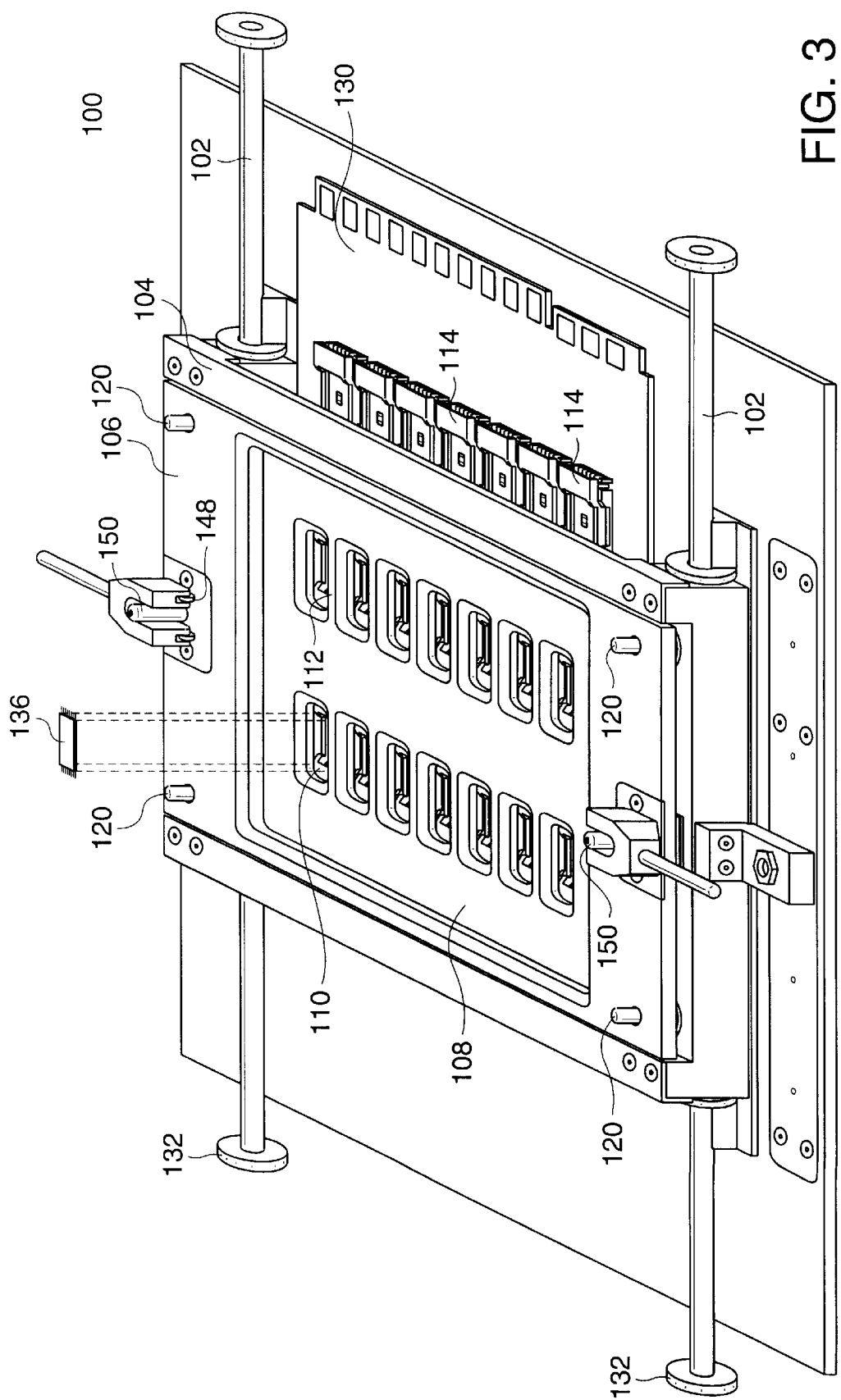
FIG. 3 is a perspective view of the apparatus for transferring a plurality of integrated circuit devices into and/or out of a plurality of sockets according to an embodiment of the present invention, wherein device is in its locked position.
Figure 4:
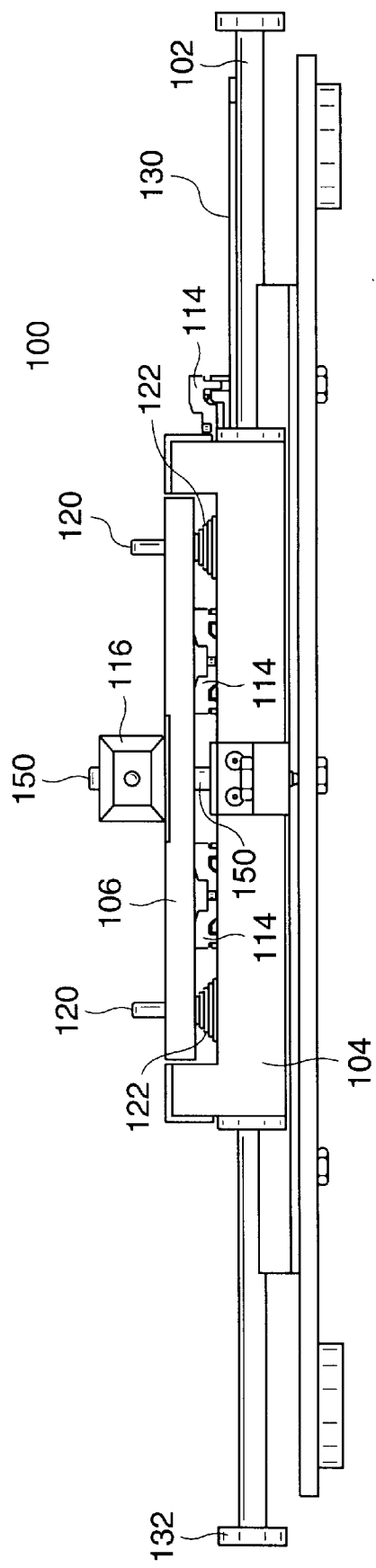
FIG. 4 is a side view of the device of FIG. 3.
Figure 5:
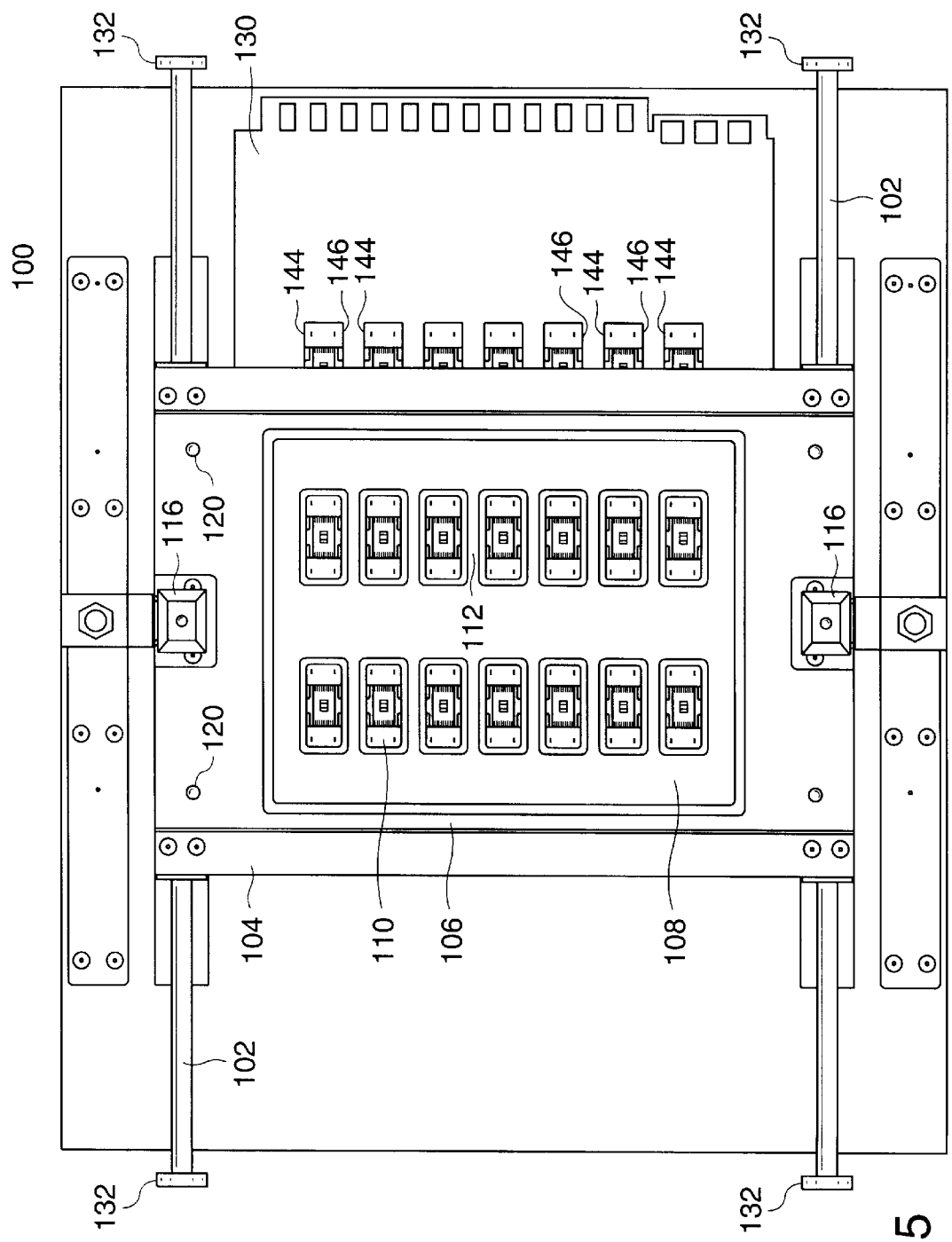
FIG. 5 is a top view of the apparatus for transferring a plurality of integrated circuit devices into and/or out of a plurality of sockets in a state in which the handle assembly is in its unlocked position.
Figure 6:
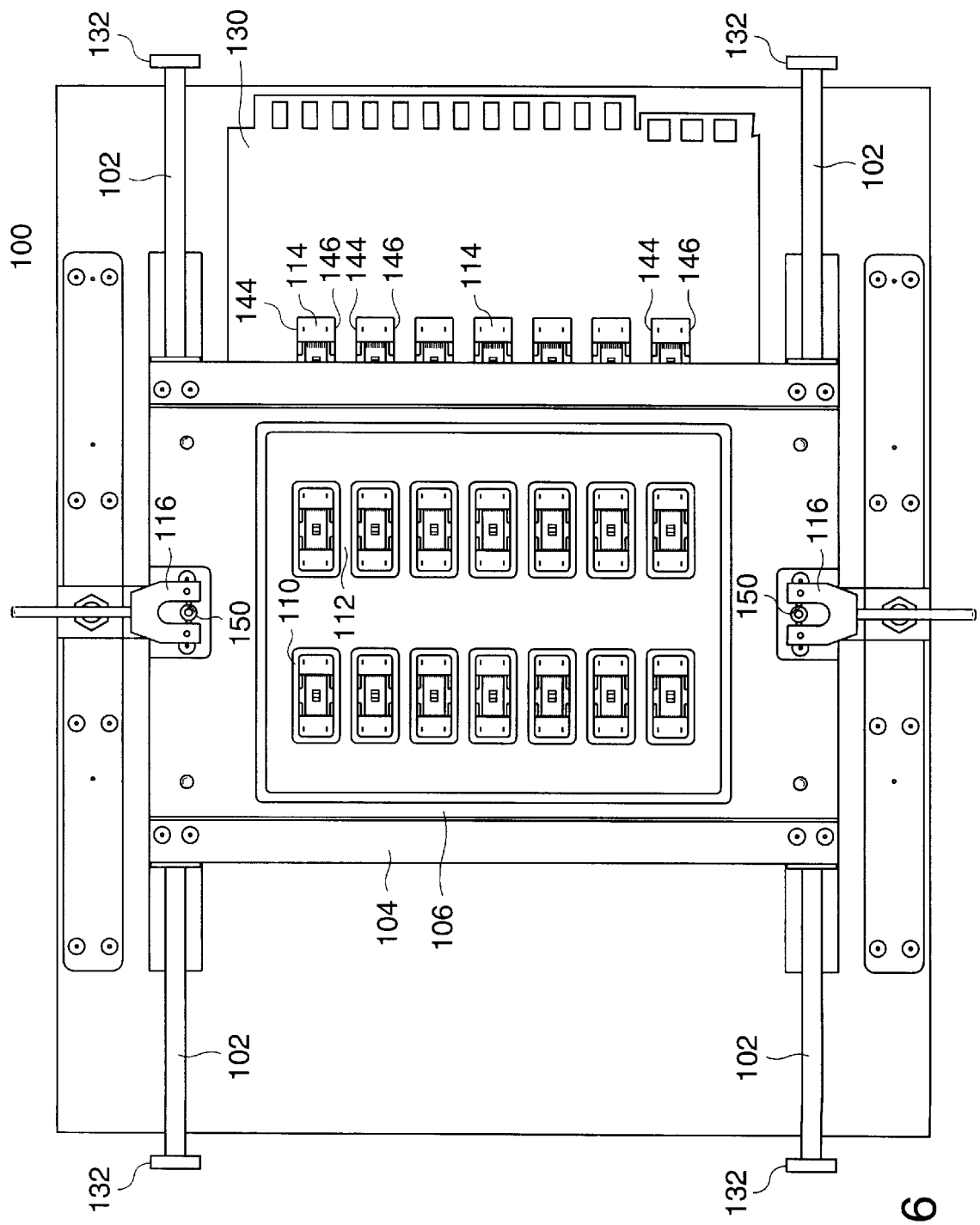
FIG. 6 is a top view of the apparatus for transferring a plurality of integrated circuit devices into and/or out of a plurality of sockets in a state in which the handle assembly is in its locked position.

A handle assembly 116 is mechanically coupled to the presser block 106 and to the presser housing 104. The handle assembly 116 is preferably configured to selectively assume an unlocked position, as shown in FIGS. 1, 2 and 5 or a locked position, as shown in FIGS. 3, 4 and 6. When the handle assembly 116 is in the unlocked position, the presser block 106 is placed in the first position in which the presser housing 104 is slideable on the guide rod(s) 102 . When the handle assembly 116 is in the locked position, the matrix of cutouts 110 are aligned with underlying sockets 114 mounted to the board 130 and the ribs 112 are in contact with and push on the underlying sockets 114 (specifically, the ribs 112 push on the lids of the underlying sockets 114). In this position, the integrated circuit devices (such as shown at 136 in FIG. 3) may be transferred into and/or out of the sockets 114. Each handle assembly 116 includes a bearing or roller assembly 148 that bears on the presser block 106 as the handle assembly 116 is transitioned between the unlocked and locked positions. A handle assembly shaft 150 (best shown in FIGS. 2, 3 and 4) secured to the presser housing 104 and engaging a corresponding through bore defined in the presser block 106 cooperates with the handle bearing or roller assembly 148 to draw the socket presser block 106 toward the presser housing 104 when the handle assembly 116 is transitioned (either manually or by an automated machine) from its unlocked to its locked position.

FIG. 2 shows a side view of the jig 100 of FIG. 1, showing the handle assembly 116 in the unlocked position, whereas FIG. 3 shows a side view of the jig 100 with the handle assembly 116 in the locked position. When the handle assembly 116 is in the unlocked position, the presser block 106 is not in contact with and does not push against the sockets 114, and the presser housing 104 and the presser block coupled thereto are free to slide on the guide rod(s) 102 in the direction of the travel arrow 134. As shown the figures, the jig 100 may include one or more presser guide posts 120 to constrain the motion of the presser block 106 to the directions parallel to the arrow 138. In the embodiment shown herein, the jig 100 includes four such presser guide posts 120, one at each corner of the jig 100. The presser guide posts 120 may each be secured to the presser housing 104 and disposed so as to at least partially engage a corresponding through bore 140 defined in the presser block 106. At least one return spring 122 may be disposed between the presser housing 104 and the presser block 106 to bias the presser block away from the presser housing 104. That is, the return spring(s) 122 may bias the presser block 106 in the direction indicated by the spring bias arrow 138 in FIG. 2. Each of the return springs 122 may be disposed around a respective presser guide post 120, although other configurations are possible. As shown most clearly in FIG. 4, when the handle assembly 116 is in its locked position, the socket presser block 106 is caused to assume its second position in which the ribs 110 push on the underlying sockets 114 to retract the contacts thereof. In this state, the return springs 122 are further compressed, as can be seen from a comparison of the return springs 122 in FIGS. 2 and 4. In this state, devices (such as integrated circuit devices 136 shown in FIG. 3) may be transferred into and/or out of the jig automatically by a loader/unloader machine or manually by an operator, using a vacuum pen or the like.

As shown in FIG. 2, the presser housing 104 and the presser block 106 coupled thereto may be slid along the direction indicated by the travel direction arrow 134, guided by the guide rod(s) 102. To ensure that the presser housing 104 and the presser block 106 are not slid too far (i.e., past their useful travel range over the board 130), each guide rod 102 may include a travel stop 132 secured to the extremities thereof. The guide rod(s) 102 may be secured to the base 124 by a guide rod supporting structure 142. The guide rod supporting structure 142 may define a topological in a surface thereof facing an underside of the presser housing 104. The topological structure may, for example, be an indentation or a depression, such as shown in FIG. 2 at 128. The presser housing 104 (or the lower free extremity of the handle assembly shaft 150) may include a bearing 126 that may be configured to roll on the guide rod supporting structure as the presser housing 104 is slid on the guide rod. The bearing 126 may perceptively drop into the indentation 128 when the cutouts 110 are aligned with underlying sockets 114. In this manner, the operator of the jig 100, by sliding the presser housing 104 (and presser block 106 coupled thereto) along the guide rod(s) 102 and feeling and/or listening for the bearing 126 dropping into the indentation 128, knows when to stop sliding the housing 104 along the guide rod(s) 102. Indeed, when the operator (not shown) feels/sees and/or hears the bearing 126 dropping into the indentation 128, he or she knows that the cutouts 110 are aligned with underlying sockets 114 and may cause the handle assembly 116 to assume its locked position (see FIGS. 3, 4 and 6), thereby placing the presser block 106 in the second position in which the ribs 112 push against the lids of the sockets 114. In this state, the sockets 114 are configured to receive the integrated circuit devices through the cutouts 110. After the integrated circuit devices have been inserted through the cutouts 110 and disposed on the sockets 114, the handle assembly 116 may be once again caused to assume its unlocked position, as shown at FIGS. 1, 2 and 5.

The sockets 114, as shown most clearly in FIGS. 5 and 6, include a first side 144 and a second side 146 spaced apart from and opposite the first side 144. To effectively push on the lids of the sockets 114, the ribs 112, defined by the cutouts 110 formed in the top surface 108 of the presser block 106, are configured to simultaneously push on the first side 144 of a first socket 114 and on the second side 146 of a second socket 114 that is disposed immediately adjacent the first socket. In this manner, the lids of each socket 114 appearing through the cutouts 10 are evenly and simultaneously depressed as the presser block 106 is transitioned to its second position when the handle assembly 116 is caused to assume its locked position, as shown in FIG. 6.

Figure 7:
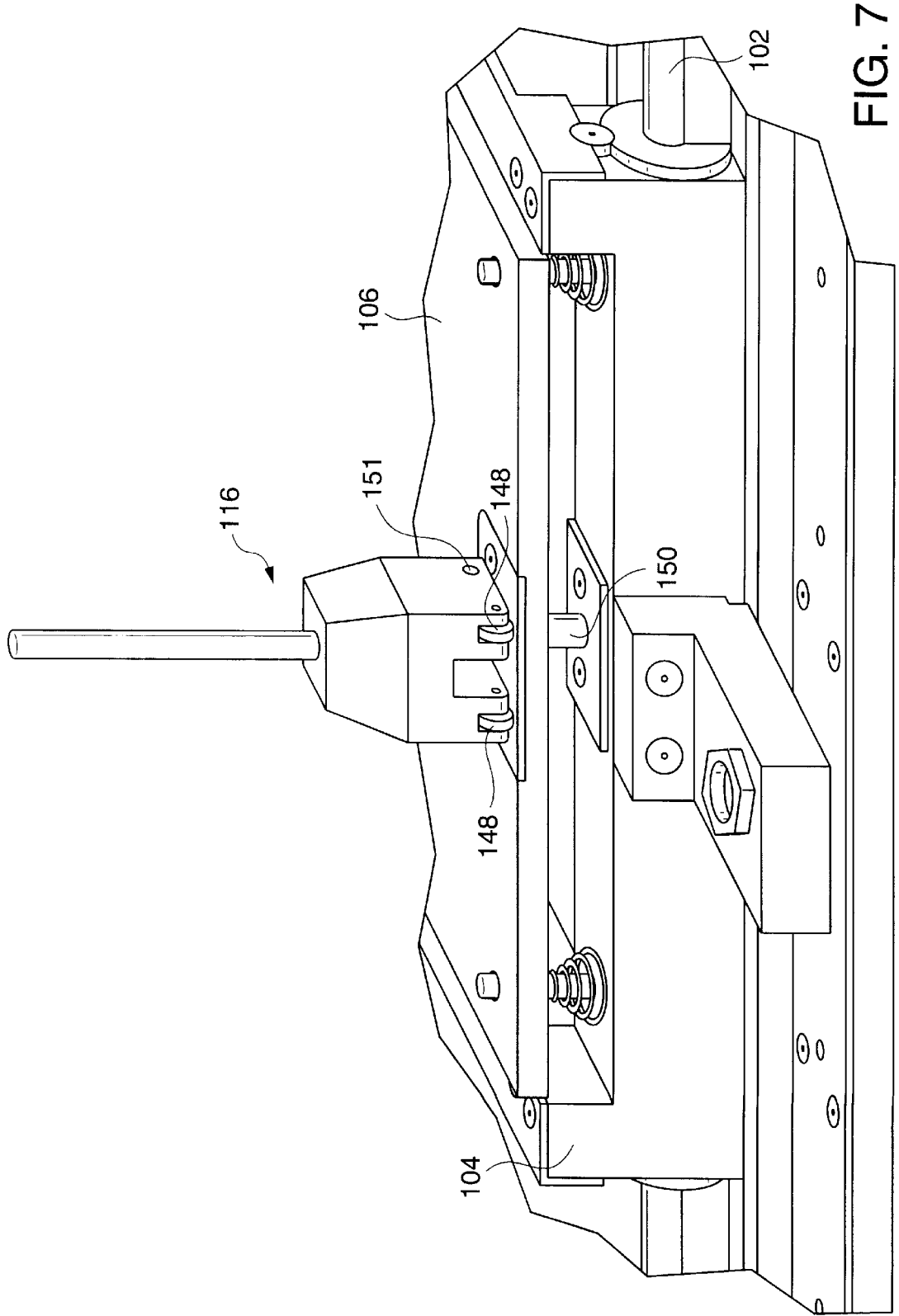
FIG. 7 is a detail perspective view of the handle assembly in the unlocked position, according to an embodiment of the present invention.
Figure 8:
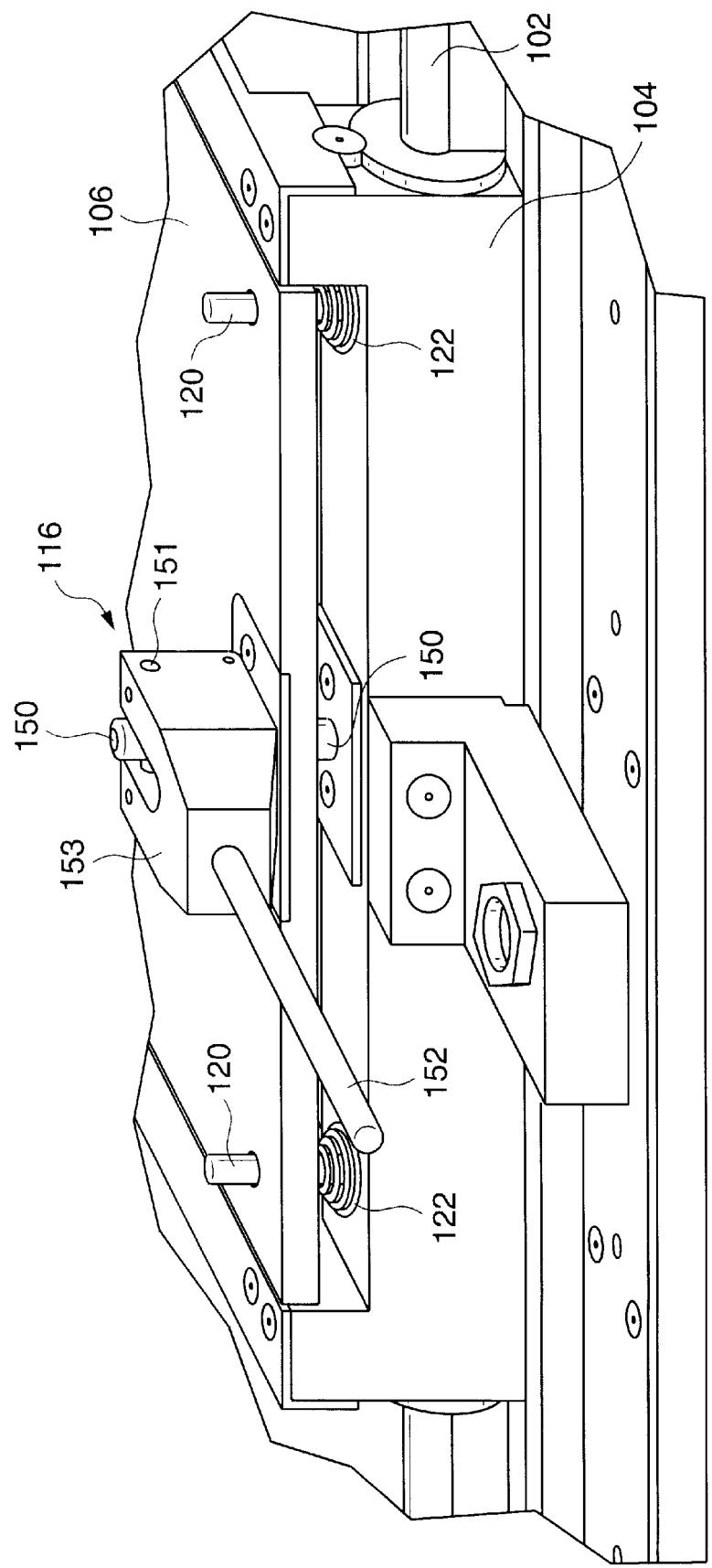
FIG. 8 shows the handle assembly of FIG. 7, in the locked position.

FIG. 7 shows a detail view of the handle assembly 116 in the unlocked position, whereas FIG. 8 shows the handle assembly 116 in its locked position, according to an embodiment of the present invention. As shown therein, the handle shaft assembly 150 is secured to the presser housing 104. The handle assembly shaft 150 engages a corresponding through bore defined in the presser block 106 and cooperates with the handle bearing or roller assembly 148 to draw the socket presser block 106 toward the presser housing 104 when the handle assembly 116 is transitioned (either manually or by an automated machine) from its unlocked to its locked position. As shown, the handle assembly 116 may include a handle portion 152 and a forked base portion 153 secured thereto. The handle shaft assembly 150, as best shown in FIG. 8, may be disposed between the branches of the forked base portion 153 and may be secured to the base portion 153 by a handle pivot pin 151, to allow the handle assembly to pivot as it is transitioned form its unlocked position (FIG. 7) to its locked position (FIG. 8). As the handle assembly shaft 150 is stationary, the handle assembly 116, as it is pivoted about the handle pivot pin 151 on its bearing or roller assembly 148, draws the socket presser block 106 toward the presser housing 104 and further compresses the return springs 122. As the presser housing 106 is drawn closer to the presser housing 104, the underside of the presser housing pushes on the lids of the underlying sockets 114 to retract the contacts thereof and to allow the devices 136 to be transferred therein.

Using the jig 100 according to the present invention, an operator may carry out one or more of the steps described below to transfer integrated circuit or other devices into and/or out of a plurality of sockets. The jig 100 according to the present invention and as shown in FIGS. 1 through 6 is placed across the sockets 114 mounted to a board 130, such as a burn in board. In practice, the jig 100 may be securely attached to a mounting surface and the burn in board 130 may be slid into the opening formed by the presser housing 104 and the mounting surface. In this manner, at least some of the plurality of sockets 114 are disposed across the presser housing 104 and the presser block 106 coupled thereto. Therefore, the presser housing 104 straddles at least a portion of the board 130. As described above, the presser block 106 defines a matrix of cutouts 110 and ribs 112 and is configured to assume a first position in which the presser block is movable and a second position in which the matrix of cutouts 110 is adapted to align with corresponding underlying sockets 114 mounted to a board 130 and in which at least some of the ribs 112 are adapted to push on the underlying sockets 114 to retract contacts thereof to allow the devices 136 to be transferred into and/or out of the underlying sockets 114.

Thereafter, the operator may carry out a first placing step to place the presser block 106 in the first position (shown in FIGS. 1, 2 and 5) and moving the presser housing 104 and the presser block 106 coupled thereto so a number of sockets 114 are aligned with the cutouts 110 defined in the top surface 108 of the presser block 106. The operator may perceive when the underlying sockets 114 are aligned with the cutouts 110 by feeling/seeing and/or hearing the bearing 126 dropping into the indentation 128, for example. The presser housing 104 is preferably configured to slide against one or more guide rods 102 and the moving step may include a step of sliding the presser housing 104 along the guide rod(s) 102 until the cutouts 110 in the presser block 110 are aligned with the underlying sockets 114. When the cutouts 110 are aligned with the underlying sockets 114, the operator may carry out a second placing step to place the presser block 106 in the second position. This causes the ribs 112 of the presser block 106 to push on the lids of the underlying sockets 114, thereby retracting the contacts thereof. The operator may then manually transfer the devices 136 into and/or out of the sockets 114 underlying the cutouts 110 or may cause a machine to do so. A vacuum pen may be used to manipulate the devices without damaging them during the transfer steps. The first and second placing steps may include steps of switching a position of a handle assembly 116 that is mechanically coupled to the presser block 106, the handle assembly 116 being configured to selectively assume an unlocked position that places the presser block 106 in the first position and a locked position that places the presser block 106 in the second position. Using the jig 100 according to the present invention and implementing the above-describe method, the operator experiences less fatigue, lessens the risk of repetitive strain injuries and may remain on task for greater periods of time than previously possible, all the while causing few (if any) bent or damaged device leads. Moreover, the speed at which devices 136 may be manually loaded/unloaded from the jig 100 rivals and may exceed the speed at which such devices may be loaded or unloaded form burn in board by costly and complex automated machines.

While the foregoing detailed description has described preferred embodiments of the present invention, it is to be understood that the above description is illustrative only and not limiting of the disclosed invention. For example, the number of cutouts 110 in the presser block 106 may vary from that illustrated in the figures. Moreover, the particular design and structure of the handle assembly 116, for example, may vary significantly from that shown and described herein without, however, departing from the scope of the present invention. Still other modifications may occur to those of skill in this art. Thus, the present invention to be limited only by the claims as set forth below.

What is claimed is:

1. Apparatus for transferring of integrated circuit devices into and/or out of a plurality of underlying sockets having contacts and mounted to a board, comprising:

at least one guide rod;

a presser housing slidingly coupled to the at least one guide rod;

a socket presser block movably coupled to the presser housing, the presser block defining a matrix of cutouts and ribs, the presser block being configured to assume a first position in which the presser housing is slideable on the guide rod and a second position in which the matrix of cutouts is aligned with the underlying sockets and in which at least some of the ribs push on the underlying sockets to retract the contacts thereof to allow the devices to be transferred into and/or out of the underlying sockets through the cutouts;

a handle assembly mechanically coupled to the presser block, the handle assembly being configured to selectively assume an unlocked position that places the presser block in the first position and a locked position that places the presser block in the second position; and a guide rod supporting structure, the structure defining an indentation therein and wherein the presser housing includes a bearing, the bearing being configured to roll on the base as the presser housing is slid on the guide rod, the bearing perceptively dropping into the indentation when the matrix of cutouts defined in the presser block is aligned with the underlying sockets.

2. The apparatus of claim 1, further including a presser guide post, the presser guide post constraining a motion of the presser block as it transitions between the first and second positions.

3. The apparatus of claim 1, further including at least one return spring disposed between the presser housing and the presser block, the return spring biasing the presser block away from the presser housing.

4. The apparatus of claim 1, wherein each of the underlying sockets includes a first side and a second side opposite the first side and wherein at least one of the ribs is configured to simultaneously push on the first side of a first socket and on the second side of a second socket disposed immediately adjacent to the first socket.

5. The apparatus of claim 1, wherein the handle assembly includes a bearing assembly that bears on the presser block as the handle assembly is transitioned between the unlocked and the locked position.

6. The apparatus of claim 1, wherein the handle assembly includes independently movable first and second handles pivotally coupled to the presser block, the first and second handles being disposed on respective sides of the presser block that are parallel to the at least one guide rod.

7. The apparatus of claim 1, wherein the presser housing and the presser block are dimensioned and oriented such that a length thereof extends at least across a width of the board.

8. The apparatus of claim 6, further including a presser guide post, the presser guide post constraining a motion of the presser block as it transitions between the first and second positions.

9. The apparatus of claim 6, further including at least one return spring disposed between the presser housing and the presser block, the return spring biasing the presser block away from the presser housing.

10. The apparatus of claim 6, wherein each of the underlying sockets includes a first side and a second side opposite the first side and wherein at least one of the ribs is configured to simultaneously push on the first side of a first socket and on the second side of a second socket disposed immediately adjacent to the first socket.

11. The apparatus of claim 7, wherein the handle assembly includes a bearing assembly that bears on the presser block as the handle assembly is transitioned between the unlocked and the locked position.

12. The apparatus of claim 6, wherein the presser housing and the presser block are dimensioned and oriented such that a length thereof extends at least across a width of the board.

13. Apparatus for transferring of integrated circuit devices into and/or out of a plurality of underlying sockets having contacts and mounted to a board, comprising:

at least one guide rod;

a presser housing slidingly coupled to the at least one guide rod;

a socket presser block movably coupled to the presser housing, the presser block defining a matrix of cutouts and ribs, the presser block being configured to assume a first position in which the presser housing is slideable on the guide rod and a second position in which the matrix of cutouts is aligned with the underlying sockets and in which at least some of the ribs push on the underlying sockets to retract the contacts thereof to allow the devices to be transferred into and/or out of the underlying sockets through the cutouts; and a handle assembly mechanically coupled to the presser block, the handle assembly being configured to selectively assume an unlocked position that places the presser block in the first position and a locked position that places the presser block in the second position, wherein the handle assembly includes independently movable first and second handles pivotally coupled to the presser block, the first and second handles being disposed on respective sides of the presser block that are parallel to the at least one guide rod.

14. The apparatus of claim 13, further including a guide rod supporting structure defining an indentation therein and wherein the presser housing includes a bearing, the bearing perceptively dropping into the indentation when the matrix of cutouts defined in the presser block is aligned with the underlying sockets.

15. The apparatus of claim 13, further including a presser guide post, the presser guide post constraining a motion of the presser block as it transitions between the first and second positions.

16. The apparatus of claim 13, further including at least one return spring disposed between the presser housing and the presser block, the return spring biasing the presser block away from the presser housing.

17. The apparatus of claim 13, wherein each of the underlying sockets includes a first side and a second side opposite the first side and wherein at least one of the ribs is configured to simultaneously push on the first side of a first socket and on the second side of a second socket disposed immediately adjacent to the first socket.

18. The apparatus of claim 13, wherein the handle assembly includes a bearing assembly that bears on the presser block as the handle assembly is transitioned between the unlocked and the locked position.

19. The apparatus of claim 13, wherein the presser housing and the presser block are dimensioned and oriented such that a length thereof extends at least across a width of the board.

* * * * *